United States Patent [19]

Schachter et al.

[11] Patent Number: 4,509,066
[45] Date of Patent: Apr. 2, 1985

[54] SPUTTERED SEMICONDUCTING FILMS OF CATENATED PHOSPHORUS MATERIAL AND DEVICES FORMED THEREFROM

[75] Inventors: Rozalie Schachter, Flushing; Marcello Viscogliosi, North Tarrytown; Lewis A. Bunz, Peekskill, all of N.Y.

[73] Assignee: Stauffer Chemical Company, Westport, Conn.

[21] Appl. No.: 509,175

[22] Filed: Jun. 29, 1983

[51] Int. Cl.$^3$ .................. H01L 49/02; C23C 15/00
[52] U.S. Cl. ............................... 357/2; 204/192 S; 357/4; 357/15; 357/61; 428/620; 428/426; 428/432; 428/938
[58] Field of Search .......... 204/192 SP, 192 S, 192 P, 204/192 D; 427/74, 86–87; 428/620, 426, 432, 938; 357/2, 4, 15, 61

[56] References Cited

PUBLICATIONS

E. A. Davis, *J. de Physique*, Colloque C4–Supplement No. 10, Tome 42, Oct. 1981, pp. C4–860.
Shanabrook and Lannin, "Structural and Vibrational Properties of Amorphous Phosphorus", *Physical Review B*, pp. 4771–4779, vol. 24, No. 8, Oct. 15, 1981.
Pomian, Pilione and Lannin, "Optical Absorption and Structural Order In Sputtered Amorphous Phosphorus", *Journal de Physique*, Coll. C4, Suppl. 10, Tome 42 Oct. 1981, pp. C4–873–C4–876.
E. A. Davis "Chemical Modification of Amorphous Arsenic", *Solar Energy Materials* 8, (1982), pp. 341–348.

*Primary Examiner*—Aaron Weisstuch
*Attorney, Agent, or Firm*—F. Eugene Davis, IV

[57] ABSTRACT

Amorphous and polycrystalline films of $KP_{15}$ are formed by RF diode sputtering targets of $KP_{15}$ and excess phosphorus in an argon phase. Substrate temperatures up to 280°–300° C. provide amorphous films. Higher temperatures provide microcrystalline or polycrystalline films. These films have high resistance and may be used as the insulator in MIS devices employing III-V semiconductors. Co-sputtering with nickel increases the conductivity of the films from approximately $10^{-10}(\text{ohm-cm})^{-1}$ to $10^{-2}(\text{ohm-cm})^{-1}$; only reduces the optical gap by 0.2 eV; and reduces the activation energy from 0.8 eV to 0.2 eV; the nickel content varying from 5–15%. Substrates include glass, silicon, tantalum, stainless steel, gallium phosphide and gallium arsenide, and glass metallized with metals such as titanium, nickel and aluminum. Double diode electrical characteristics have been observed in devices formed on metallized glass substrates having co-sputtered thereon thin film polyphosphides and nickel with nickel and titanium top contacts.

40 Claims, 1 Drawing Figure

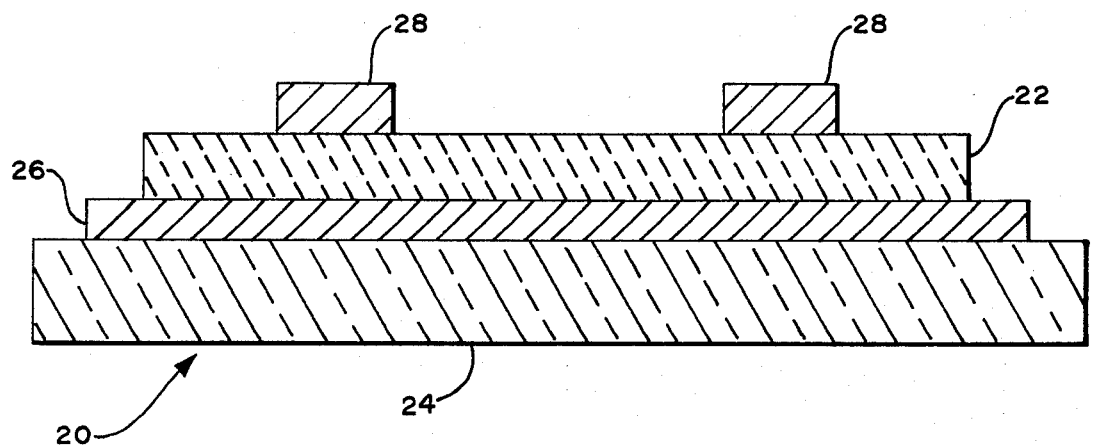

SPUTTERED SEMICONDUCTING FILMS OF CATENATED PHOSPHORUS MATERIAL AND DEVICES FORMED THEREFROM

RELATED APPLICATIONS

This application is related to the following co-pending applications, assigned to the same assignee as this application. These applications are incorporated herein by reference. U.S. patent application entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982; and, CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982, which is a Continuation-in-Part of Ser. Nos. 335,706 and 419,537; and the applications filed herewith of David G. Brock and John A. Baumann entitled VACUUM EVAPORATED FILMS OF CATENATED PHOSPHORUS MATERIAL; Christian G. Michel, Henry S. Marek, and John A. Baumann, entitled LIQUID PHASE GROWTH OF CRYSTALLINE POLYPHOSPHIDES; Diego Olego, David G. Brock, John A. Baumann, and Willian E. Spicer, entitled MIS DEVICES EMPLOYING ELEMENTAL PNICTIDE OR POLYPHOSPHIDE INSULATING LAYERS; and, Gary K. Miller, John A. Baumann, David G. Brock, and Mark A. Kuck, entitled GRAPHITE INTERCALATED ALKALI METAL VAPOR SOURCES.

TECHNICAL FIELD

This invention relates to sputtered semiconducting films of catenated phosphorus material. More particularly it relates to such films and the modification of the resistivity thereof by the incorporation of co-sputtered metals, and to the manufacture of electronic semiconductor devices, electro-optical devices, thin films, optical films and coatings.

BACKGROUND ART

The above-identified, previously filed, co-pending applications disclose semiconductors formed of catenated phosphorus materials. It is highly desirable that uniform thin films of these materials be formed on a variety of substrates for use in electronic and electro-optical devices, as optical films, coatings and the like. It is further highly desirable that an easy and convenient method be found to reduce the intrinsic resistivity of these materials and their conductivity activation energy.

DISCLOSURE OF THE INVENTION

We hve produced high quality thin films of polyphosphides, namely $KP_x$, where x is equal to or greater than 15, by sputtering. We have provided such high quality thin films covering a surface area of more than 100 square centimeters. We have successfully deposited highly insulating films on III–V materials. In addition, we have increased the conductivity of these films by co-sputtering with nickel. The thin films thus produced may be used in semiconductor devices, for coatings, for optical films, in electro-optical devices and the like.

Using RF diode sputtering with an argon plasma at a pressure of approximately 10 millitorr and 100 watts of power, glass substrates located 5 cm from the target and the substrate temperatures between 25° and 300° C., we have produced film thicknesses up to 4 microns on glass substrates. Gallium phosphide, gallium arsenide, silicon, tantalum, and stainless steel substrates, as well as metallized glass substrates, metallized with titanium, nickel, aluminum and the like, have been successfully coated. We believe that many other substrates including indium phosphide may also be coated. Based on X-ray data, films grown on a substrate at a temperature grater than 300° C. are polycrystalline or microcrystalline. When the substrate temperature is below 280° C., amorphous films are produced. Both may be utilized in semiconductor devices, electro-optical devices, coatings and the like, as discussed in detail in the above-identified, previously filed, co-pending applications.

On preferred target comprises $KP_{15}$ formed by a condensed phase process as described in detail in the above-identified, previously filed, co-pending applications, pressed under 30,000 pounds per square inch pressure, into a 2 inch diameter, ¼ inch thick disk. Pieces of $KP_x$, where x is much greater than 15, ¼ inch thick, sliced from a boule grown in a single source process as described in the above-identified, previously filed co-pending applications, are glued to the condensed phase $KP_{15}$ disk, which then has about 20 to 70% excess phosphorus by weight over that of pure $KP_{15}$. The $KP_x$ slices where x is much greater than 15 cover approximately 30 to 50% of the area of the target and the disks of nickel cover approximately 5 to 10%. We have obtained shiny stable films of from 0.5 to 2.5 microns in thickness under the following conditions; RF diode mode, argon pressure of 10 millitorr, substrate temperature approximately 280°–300° C., power 200 watts, target voltage 2,400 volts, and a deposition sputtering time of 1.5 hours.

The films contain 5 to 15% nickel; all show increased conductivity; some as high as $10^{-4}$ (ohm-cm)$^{-1}$ compared with approximately $10^{-10}$ (ohm-cm)$^{-1}$ in films where no nickel is present.

We have demonstrated that the conductivity modification was of a true semiconductor and not a metallic alloy type by measuring the conductivity activation energy of the films in vacuo. The activation energy was reduced from 0.8 eV in intrinsic materials (i.e. no nickel present) to 0.2 eV and the optical gap was reduced by only 0.2 eV. Thus, we believe that nickel acts as a dopant.

Films including nickel deposited on a previously metallized glass substrate and then having nickel or titanium top contacts applied thereto by vacuum evaporation, show a double diode characteristic at both interfaces between the metals and the nickel containing material. Significant current in the order of milliamps can be drawn through the devices.

We believe similar films of $MP_x$ where M is an alkali metal and x is equal to or greater than 15 may be formed by the same process and may have their properties changed in the same manner by co-sputtering with nickel.

Alternatively, the excess phosphorus supplied by the $KP_x$ pieces, where x is much greater than 15, may be supplied by other means. We have, for example, used mixtures of condensed phase $KP_{15}$ and red phosphorus powders for the target disk as well as mixtures of $KP_{15}$ and crystalline phosphorus formed as a condensed phase charge from a ball milled mixture. We believe that the excess phosphorus may be supplied by sputtering a pure $KP_{15}$ target and depositing on a substrate in the presence of phosphine ($PH_3$) gas.

We also believe that other metals having unfilled d or f orbitals co-sputtered with these semiconducting catenated phosphorus materials ($MP_x$ where M is an alkali metal, and x ranges from 15 to infinity) will similarly alter their intrinsic properties and thus increase the conductivity and unpin the Fermi level, i.e., act as dopant.

OBJECTS OF THE INVENTION

It is therefore an object of the invention to provide sputtered films of catenated phosphorus materials.

Another object of the invention is to provide insulating films on III-V materials.

Still another object of the invention is to increase the conductivity and decrease the conductivity activation energy of semiconducting films of catenated phosphorus materials without significantly reducing the optical band gap.

A further object of the invention is to provide such films on a variety of substrates.

Still another object of the invention is to provide semiconductor and electro-optical devices, optical films, and coatings.

Other objects of the invention will in part be obvious and will in part appear elsewhere in this application.

The invention accordingly comprises several steps and the relation of one or more of such steps with respect to each of the others and the articles possessing the features, properties and the relation of elements which are exemplified in this application. The scope of the invention is indicated in the claims.

BRIEF DESCRIPTION OF THE DRAWINGS

For a fuller understanding of the nature and objects of the invention reference should be made to the following detailed description taken in connection with the accompanying drawing in which the sole FIGURE is a schematic diagram of a semiconductor device according to the invention.

BEST MODE FOR CARRYING OUT THE INVENTION

RF diode sputtering was performed in a Materials Research Corporation Model 86-20 sputterer with a variety of targets and substrates. Argon was used for the plasma. The substrates were located approximately 5 centimeters from a water cooled target. The substrate's temperature was controlled. Good quality $KP_{15}$ films of 0.2 to 4.0 microns thickness were produced on a variety of substrates.

Due to the high volatility of phosphorus, pure $KP_{15}$ targets cannot be used as they will only produce films high in potassium. We discovered that in order to produce $KP_{15}$ films, excess phosphorus must be provided. Our preferred source of excess phosphorus is $KP_x$ where x is much greater than 15, grown by the single source vapor transport process of the above-identified, previously filed, applications. Other sources we have employed include bulk red phosphorus and crystalline phosphorus formed in the condensed phase process of the above-identified, previously filed, applications. We also believe that phosphine gas could also be used.

Although we have used RF diode sputtering, we believe other sputtering modes, such as direct current and magnetron, will also be successful.

EXAMPLE 1

In one example, a target composed of a mixture of condensed phase $KP_{15}$ plus 60% red phosphorus was prepared by pressing at 30,000 psi into a 2″ diameter disk. The sputtering parameters were the following:

Argon pressure=10 millitorr, RF power=140 watts target voltage=2,400 V, substrate temperature=300° C. deposition time=7 hours. In this run the deposited films were approximately 3 microns thick. Some of the films, deposited on a glass substrate, were analyzed for chemical composition by X-ray fluorescence and had $KP_{15}$ composition. Raman structure and X-ray diffraction pattern identified a crystalline $KP_{15}$ film. The electro-optical properties were measured: the conductivity was approximately $10^{-10}$ (ohm-cm)$^{-1}$; the activation energy of conductivity was 0.7 eV; the optical gap was 1.7 eV; photoluminescence was observed at 1.75 eV. The photoconductivity ratio under one sun illumination was approximately $10^{+2}$.

EXAMPLE 2

In this example the target was prepared from condensed phase $KP_{15}$ with pellets of bulk $KP_x$, where x is very much greater than 15, obtained from single source vapor transport, and covering approximately 50% of the target area, and Ni disks covering approximately 10% of the target area.

The sputtering parameters were: Argon pressure=10 millitorr; RF power approximately 150 Watts; target voltage=2,400 Volts; time=1.5 hours; substrate temperature=280° C.

These films were analyzed for Ni content and composition. Depending on the position of the substrate relative to the intensity of the plasma, we obtained amorphous films of $KP_{15}$ composition closer to the center of the plasma and $KP_{20}$ five centimeters away from the center of the plasma. The Ni content in the above two films is 15% and 8%, respectively. These films have been deposited on glass, metallized glass (Ni, Ti), polished single crystal Si, polished GaP, stainless steel, and Ta substrates.

The electro-optical properties of such films were measured. A film with 8% Ni concentration has its resistivity lowered from $10^{10}$(ohm-cm) to $10^4$(ohm-cm) and conductivity activation energy reduced to 0.3 eV from 0.8 eV. On the other hand, the optical gap, measured by transmission edge only, dropped from 1.7 to 1.5 eV, indicating that the material consists of amorphous polyphosphide matrix with the Ni contributing to reduction in resistivity and unpinning the Fermi level.

Referring to the FIGURE, electronic devices generally indicated at 20, prepared with such a material 22 as described above in a sandwich configuration on a glass substrate 24 with a metallic back contact 26 of Ni, Ti, or Ta and metal dot top contacts 28 of Ni or Ti, show current-voltage and capacitance-voltage characteristics of two reverse biased diodes. The nonlinearity in the I-V curve is strong, with current capability in the milliamp range on devices having an area of $10^{-3}$(cm)$^2$.

EXAMPLE 3

This example was similar in parameters to Example 2, except the Ni concentration on the target is approximately 6% and the excess phosphorus was provided from pieces of commercial red amorphous phosphorus placed onto the target. The Ni concentration in the resulting films is approximately 6%, the resistivity was reduced to $10^6$(ohm-cm), the activation energy is 0.5 eV.

Device characteristics were similar to example 2.

It will thus be seen that the objects set forth above, among those made apparent from the preceding description, are efficiently obtained and, since certain changes may be made in carrying out the above methods and in the articles set forth without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly, it is to be understood that in the claims, ingredients or compounds recited in the singular are intended to include compatible mixtures of such ingredients wherever the sense permits.

Having described our invention what we claim as new and desire to secure by Letters Patent is:

1. A semiconducting film of catenated phosphorus formed on a substrate by sputtering, wherein said film comprises $MP_x$, where x is equal to or greater than 15, and M is an alkali metal.

2. The method of making a semiconducting catenated phosphorus thin film on a substrate comprising sputtering a thin film onto a substrate, wherein said thin film comprises $MP_x$, where x is equal to or greater than 15, and M is an alkali metal.

3. A semiconductor device comprising a thin film of catenated phosphorus formed by sputtering onto a substrate, wherein said thin film comprises $MP_x$, where x is equal to or greater than 15, and M is an alkali metal.

4. A thin film of $MP_x$ formed on a substrate where x is equal to or greater than 15 and M is an alkali metal and said thin film is formed by sputtering onto said substrate.

5. The article defined in claim 4 where M is potassium.

6. The article defined in claim 5 wherein x is substantially equal to 15.

7. That which is claimed in any of claims 1, 2 or 3 wherein x is substantially equal to 15.

8. That which is claimed in any of claims 1, 2, or 3, wherein said substrate is glass.

9. That which is claimed in claim 8 wherein said glass substrate has a metal layer thereon and said film is deposited on said metal layer.

10. That which is claimed in claim 9 wherein said metal is nickel.

11. That which is claimed in claim 9 wherein said metal is titanium.

12. That which is claimed in claim 9 wherein said metal is aluminum.

13. That which is claimed in any of claims 1, 2, or 3, wherein said substrate is silicon.

14. That which is claimed in any of claims 1, 2, or 3, wherein said substrate is tantalum.

15. That which is claimed in any of claims 1, 2, or 3, wherein said substrate is stainless steel.

16. That which is claimed in any of claims 1, 2, or 3, wherein said substrate is a III-V semiconductor.

17. That which is claimed in claim 16 wherein said semiconductor substrate is gallium phosphide.

18. That which is claimed in claim 16 wherein said semiconductor substrate is gallium arsenide.

19. That which is claimed in claim 16 wherein said semiconductor substrate is indium phosphide.

20. That which is claimed in any of claims 1, 2, 3, or 4, wherein said sputtering is RF sputtering in an argon atmosphere.

21. That which is claimed in any of claims 1, 2, 3, 4, 5, or 6, wherein said thin film is an active semiconducting film in a semiconductor device.

22. That which is claimed in any of claims 1, 2, 3, 4, 5, or 6, wherein said film comprises a metal incorporated by co-sputtering.

23. That which is claimed in claim 22 wherein said metal has unfilled d or f orbitals.

24. That which is claimed in claim 22 wherein said metal is nickel.

25. That which is claimed in claim 24 wherein said film substantially comprises 5 to 15% nickel.

26. The method of sputtering a film of $MP_x$ on a substrate where M is an alkali metal and x is substantially equal to or greater than 15, comprising:
    A. providing a target of $MP_{15}$, and
    B. providing a source of additional phosphorus.

27. The method of claim 26 wherein said additional source is provided by incorporating elemental phosphorus at the target of $MP_{15}$.

28. The method of claim 26 wherein said additional source is provided by providing pieces of $MP_x$, where x is very much greater than 15, at the target of $MP_{15}$.

29. The method of claim 26 wherein said additional source is provided by providing phosphine gas during sputtering.

30. The method of any of claims 26, 27, 28, or 29, wherein M is potassium.

31. The method of forming a semiconductor device comprising $MP_x$, where M is an alkali metal and x is equal to or greater than 15, comprising:
    A. providing a target comprising phosphorus, an alkali metal and a metal dopant, and
    B. sputtering a film of $MP_x$ and said metal dopant onto a substrate from said target.

32. The method of reducing the intrinsic resistance of a semiconducting film of $MP_x$, where M is an alkali metal and x is equal to or greater than 15, by co-sputtering $MP_x$ and a non-alkali metal dopant onto a substrate.

33. The method of claims 31 or 32, wherein said dopant metal has unfilled d or f orbitals.

34. The method of claim 33 wherein said metal is nickel.

35. The method of claim 34 wherein said nickel comprises 5 to 15% of said film.

36. A diode comprising a semiconducting film of $MP_x$, where M is an alkali metal and x is equal to or greater than 15, incorporating a metal dopant having unfilled d or f orbitals, said film formed by sputtering.

37. A diode as defined in claim 36 having a metal film in contact with said film.

38. A diode as defined in claim 37 wherein said metal film is nickel.

39. A diode as defined in claim 37 wherein said metal film is tantalum.

40. A diode as defined in claim 37 wherein said metal film is titanium.

* * * * *